United States Patent
Chen et al.

(10) Patent No.: US 8,674,760 B2
(45) Date of Patent: Mar. 18, 2014

(54) DYNAMIC POWER CONTROL METHOD AND CIRCUIT THEREOF

(75) Inventors: Wen-Yen Chen, Taichung (TW); Ming-Hung Chang, Hsinchu County (TW)

(73) Assignee: Anpec Electronics Corporation, Hsinchu Science Park, Hsin-Chu (TW)

( * ) Notice: Subject to any disclaimer, the term of this patent is extended or adjusted under 35 U.S.C. 154(b) by 0 days.

(21) Appl. No.: 13/535,356

(22) Filed: Jun. 27, 2012

(65) Prior Publication Data

US 2013/0241644 A1   Sep. 19, 2013

(30) Foreign Application Priority Data

Mar. 14, 2012   (TW) .............................. 101108691 A

(51) Int. Cl.
    *H03G 3/20* (2006.01)
(52) U.S. Cl.
    USPC ......................................................... 330/127
(58) Field of Classification Search
    USPC .................................................. 330/127, 297
    See application file for complete search history.

(56) References Cited

U.S. PATENT DOCUMENTS

| | | | |
|---|---|---|---|
| 5,450,037 A * | 9/1995 | Kanaya et al. | 330/297 |
| 6,614,310 B2 | 9/2003 | Quarfoot | |
| 6,975,172 B2 * | 12/2005 | Craynon et al. | 330/297 |
| 7,741,914 B1 | 6/2010 | Nabicht | |
| 7,750,732 B1 | 7/2010 | Delano | |
| 7,880,548 B2 | 2/2011 | Ye | |
| 8,072,266 B1 * | 12/2011 | Hoomes et al. | 330/297 |
| 8,446,219 B2 * | 5/2013 | Mohajeri et al. | 330/297 |

* cited by examiner

*Primary Examiner* — Khanh V Nguyen
(74) *Attorney, Agent, or Firm* — Winston Hsu; Scott Margo

(57) ABSTRACT

The present invention discloses a dynamic power control method utilized in an amplifier. The dynamic power control method includes detecting an absolute difference between a positive supply voltage of the amplifier and an output voltage of the amplifier, to acquire a positive voltage difference; detecting an absolute difference between a negative supply voltage of the amplifier and the output voltage of the amplifier, to acquire a negative voltage difference; and adjusting the positive supply voltage and the negative supply voltage according to the positive voltage difference, the negative voltage difference and a threshold.

18 Claims, 6 Drawing Sheets

DYNAMIC POWER CONTROL METHOD AND CIRCUIT THEREOF

BACKGROUND OF THE INVENTION

1. Field of the Invention

The present invention relates to a dynamic power control method and circuit thereof, and more particularly, to a dynamic power control method and circuit thereof capable of dynamically adjusting supply voltages of an amplifier according to differences between an output signal of the amplifier and supply voltages of the amplifier.

2. Description of the Prior Art

Amplifiers are basic circuit components frequently used in the analog integrate circuit. Generally, supply voltages of an amplifier is fixed to a maximum voltage for maximizing the input dynamic range and the output dynamic range of the amplifier, such that the amplifier can undistortedly convert an input signal with maximum swing to an output signal. The amplifier generates huge operational current when the supply voltage is designed to the maximum voltage. However, the amplifier may need less operational current for processing the input signal with small swing. In such a condition, the most part of the operational current becomes idle current that results in unnecessary power consumption. In other words, if the supply voltage of the amplifier is set to the maximum voltage, the efficiency of the amplifier is significantly decreased.

The prior art utilizes an input signal detection circuit for detecting the swing of the input signal, to appropriately adjust the supply voltages of the amplifier. The unnecessary power consumption can be therefore avoided. However, except for detecting the swing of the input signal, the input signal detection circuit needs to detect the structure and the gain of the amplifier for accurately adjusting the supply voltage, to achieve the goal of generating undistorted output signal. In other words, the input signal detection circuit needs to be modified when the structure or the gain of the amplifier is changed according to different applications. The design flow of the amplifier is therefore complicated and the cost of the amplifier is increased. Thus, there is a need for improving the prior art.

SUMMARY OF THE INVENTION

Therefore, the present invention discloses a dynamic power control method capable of dynamically adjusting the supply voltages of the amplifier according to differences between the output signal of the amplifier and the supply voltages of the amplifier and circuit thereof.

The present invention discloses a dynamic power control method utilized in an amplifier. The dynamic power control method includes detecting an absolute difference between a positive supply voltage of the amplifier and an output voltage of the amplifier, to acquire a positive voltage difference; detecting an absolute difference between a negative supply voltage of the amplifier and the output voltage of the amplifier, to acquire a negative voltage difference; and adjusting the positive supply voltage and the negative supply voltage according to the positive voltage difference, the negative voltage difference and a threshold.

The present invention further discloses a dynamic power control circuit utilized in an amplifier. The dynamic power control circuit includes a power converting module, for converting a system supply voltage to a positive supply voltage of the amplifier and a negative supply voltage of the amplifier according to a power control signal; and a level detection module, including a first detection unit, for detecting an absolute difference between an output voltage of the amplifier and the positive supply voltage to acquire a positive voltage difference, and comparing the positive voltage difference and a threshold to output a positive control signal; a second detection unit, for detecting an absolute difference between the output voltage and the negative supply voltage to acquire a negative voltage difference, and comparing the negative voltage difference and the threshold to output a negative control signal; and a logic unit, coupled to the power converting module, for outputting the power control signal according to the positive control signal and the negative control signal.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
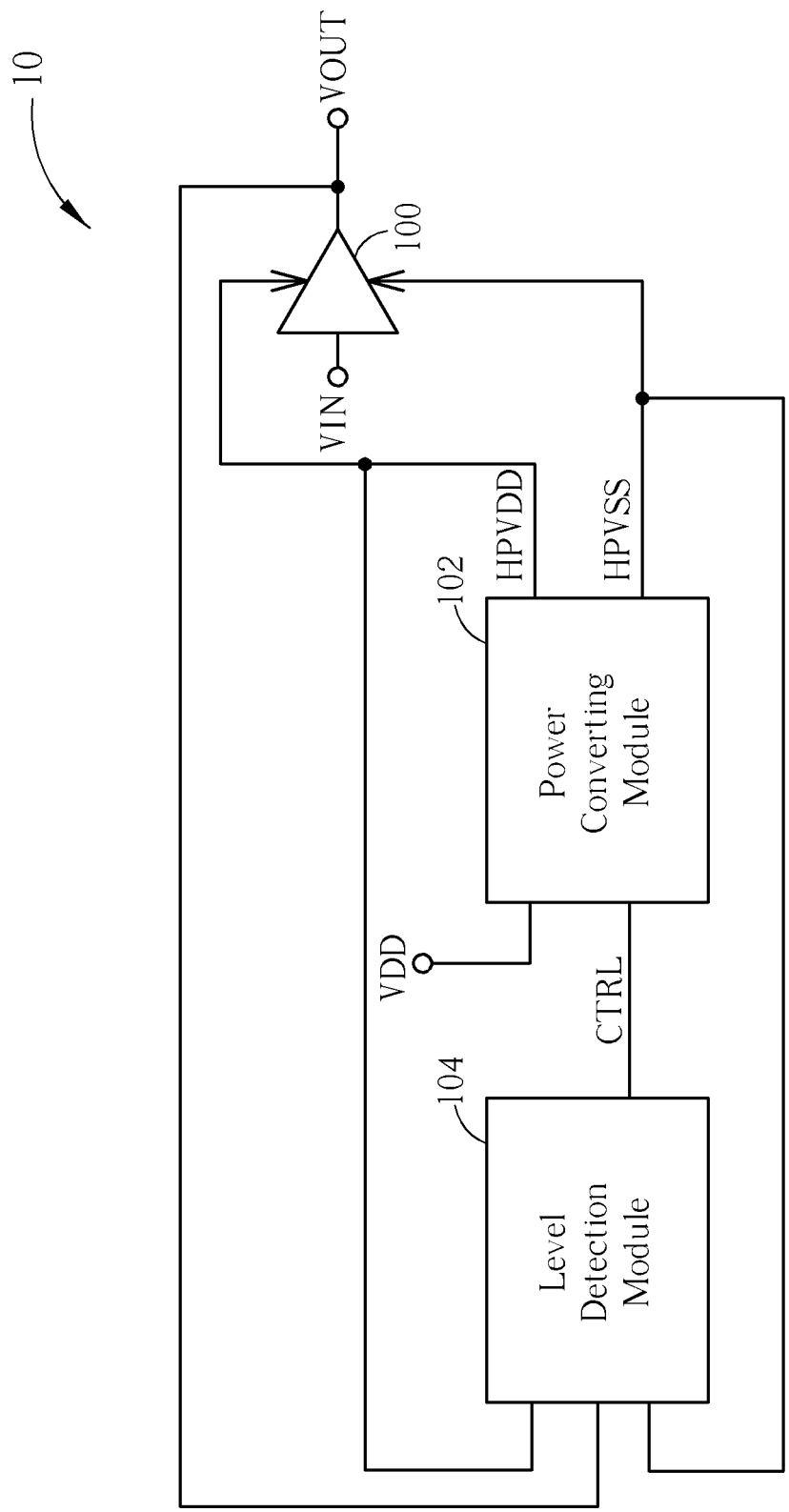
FIG. 1 is a schematic diagram of an amplifier system according to an embodiment of the present invention.

Please refer to FIG. 1, which is a schematic diagram of an amplifier system 10 according to an embodiment of the present invention. The amplifier system 10 is utilized for undistortedly converting an input signal VIN to an output signal VOUT. As shown in FIG. 1, the amplifier system comprises an amplifier module 100, a power converting module 102 and a level detection module 104. The amplifier module 100 is utilized for receiving the input signal VIN and accordingly outputting the output signal VOUT. The power converting module 102 is utilized for converting a system supply voltage VDD to supply voltages HPVDD and HPVSS of the amplifier module 100 according to a control signal CTRL, wherein the supply voltage HPVDD is within a range between a voltage V1 and a voltage V2 and the supply voltage HPVSS is within a range between a voltage (−V1) and a voltage (−V2). The voltage V1 is greater than the voltage V2 and the voltage (−V1) is smaller than the voltage (−V2). For example, the voltage V1 can be the system supply voltage VDD and the voltage (−V1) can be the negative system supply voltage −VDD, but are not limited herein. The level detection module 104 is utilized for detecting an absolute difference between the output signal VOUT and the supply voltage HPVDD to acquire a positive voltage difference P_DIFF (i.e. P_DIFF=|HPVDD−VOUT|), and detecting an absolute difference between the output signal VOUT and the supply voltage HPVSS to acquire a negative voltage difference N_DIFF (i.e. N_DIFF=|HPVSS−VOUT|). After acquiring the positive voltage difference P_DIFF and the negative voltage difference N_DIFF, the level detection module 104 outputs the control signal CTRL according to the positive voltage difference P_DIFF, the negative voltage difference N_DIFF and a threshold VTH. The threshold VTH is selected from thresholds VTH1 and VTH2 according to the voltage of the supply voltages HPVDD and HPVSS.

In detail, the threshold VTH is the threshold VTH1 when the supply voltages HPVDD and HPVSS are the voltages V1 and (−V1), respectively. In such a condition, if the level detection module 104 detects both the positive voltage difference P_DIFF and the negative voltage difference N_DIFF are greater than the threshold VTH1, the differences between the output signal VOUT and the supply voltages HPVDD, HPVSS are large enough, such that the output dynamic range of the amplifier module 100 can be narrowed and the output signal VOUT would not be distorted. The level detection module 104 therefore outputs a control signal CTRL indicating a low output status for controlling the power converting module 102 to adjust the supply voltage HPVDD to the voltage V2 and adjust the supply voltage HPVSS to the voltage (−V2), such that the output dynamic range and the power consumption of the amplifier module 100 are reduced.

Further, the threshold VTH is switched to the threshold VTH2 when the supply voltages HPVDD and HPVSS are the voltages V2 and (−V2), respectively. In such a condition, if the level detection module 104 detects the positive difference P_DIFF is smaller than the threshold VTH2, the difference between the output signal VOUT and the supply voltage HPVDD is too small, i.e. the output dynamic range of the amplifier module needs to be increased for avoiding the output signal VOUT being distorted. The level detection unit 104 therefore outputs the control signal CTRL indicating a high output status for controlling the power converting module 102 to adjust the supply voltage HPVDD to the voltage V1 and adjust the supply voltage HPVSS to the voltage (−V1), to increase the output dynamic range of the amplifier module 100. Similarly, if the negative voltage difference N_DIFF is smaller than the threshold VTH2, the difference between the output signal VOUT and the supply voltage HPVSS is too small, i.e. the output dynamic range of the amplifier module 100 needs to be increased for avoiding the output signal VOUT being distorted. The level detection unit 104 therefore outputs the control signal CTRL indicating the high output status for controlling the power converting module 102 to adjust the supply voltage HPVDD to the voltage V1 and adjust the supply voltage HPVSS to the voltage (−V1), to increase the output dynamic range of the amplifier module 100. As a result, the amplifier system 10 can dynamically adjust the supply voltages HPVDD and HPVSS according to the positive voltage difference P_DIFF and the negative voltage difference N_DIFF via the power converting module 102 and level detection module 104, to decrease the average power consumption of the amplifier module 100.

Figure 2:
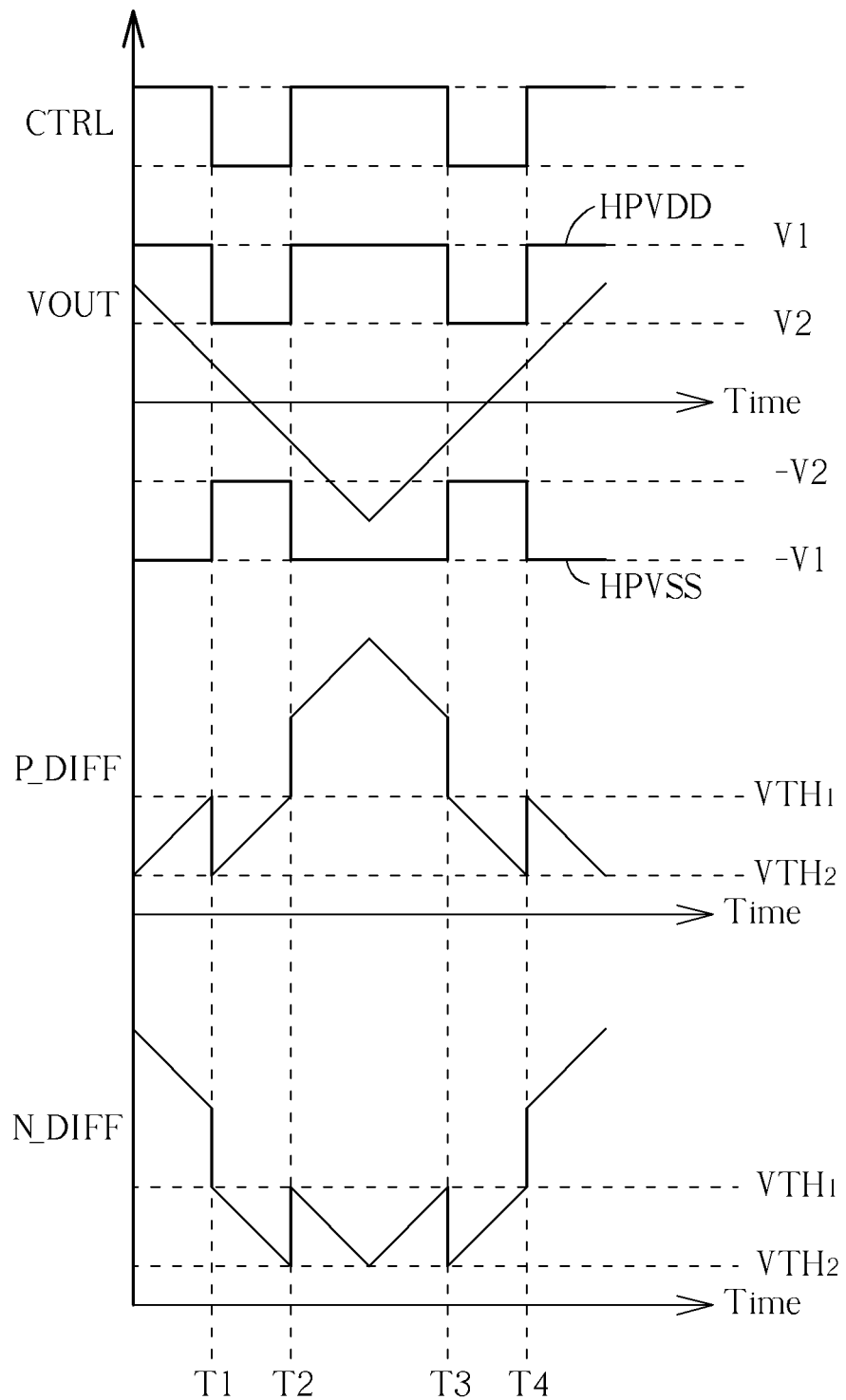
FIG. 2 is a waveform of related signals when the amplifier system shown in FIG. 1 is operating.

Please refer to FIG. 2, which is a waveform of related signals when the amplifier system 10 shown in FIG. 1 is operating. As shown in FIG. 2, the control signal CTRL is in high logic level for setting the supply voltages HPVDD and HPVSS to the voltages V1 and (−V1), respectively, before a time T1. At the time T1, the positive voltage difference P_DIFF exactly exceeds the threshold VTH1 and the negative voltage difference N_DIFF is greater than the threshold VTH1. The control signal CTRL is switched to low logic level for adjusting the supply voltages HPVDD and HPVSS to the voltages V2 and (−V2), respectively. Next, at a time T2, the negative voltage difference N_DIFF is exactly lower than the threshold VTH2. The control signal CTRL is therefore switched to high logic level for adjusting the supply voltages HPVDD and HPVSS to the voltages V1 and (−V1). Then, at a time T3, the positive voltage difference P_DIFF is greater than the threshold VTH1 and the negative voltage difference N_DIFF exactly exceeds the threshold VTH1. The control signal CTRL is therefore switched to low logic level for adjusting the supply voltages HPVDD and HPVSS to the voltages V2 and (−V2), respectively. Finally, at a time T4, the positive voltage difference P_DIFF is exactly lower than the threshold VTH2. The control signal is switched to high logic level for adjusting the supply voltages HPVDD and HPVSS to voltages V1 and (−V1).

Figure 3:
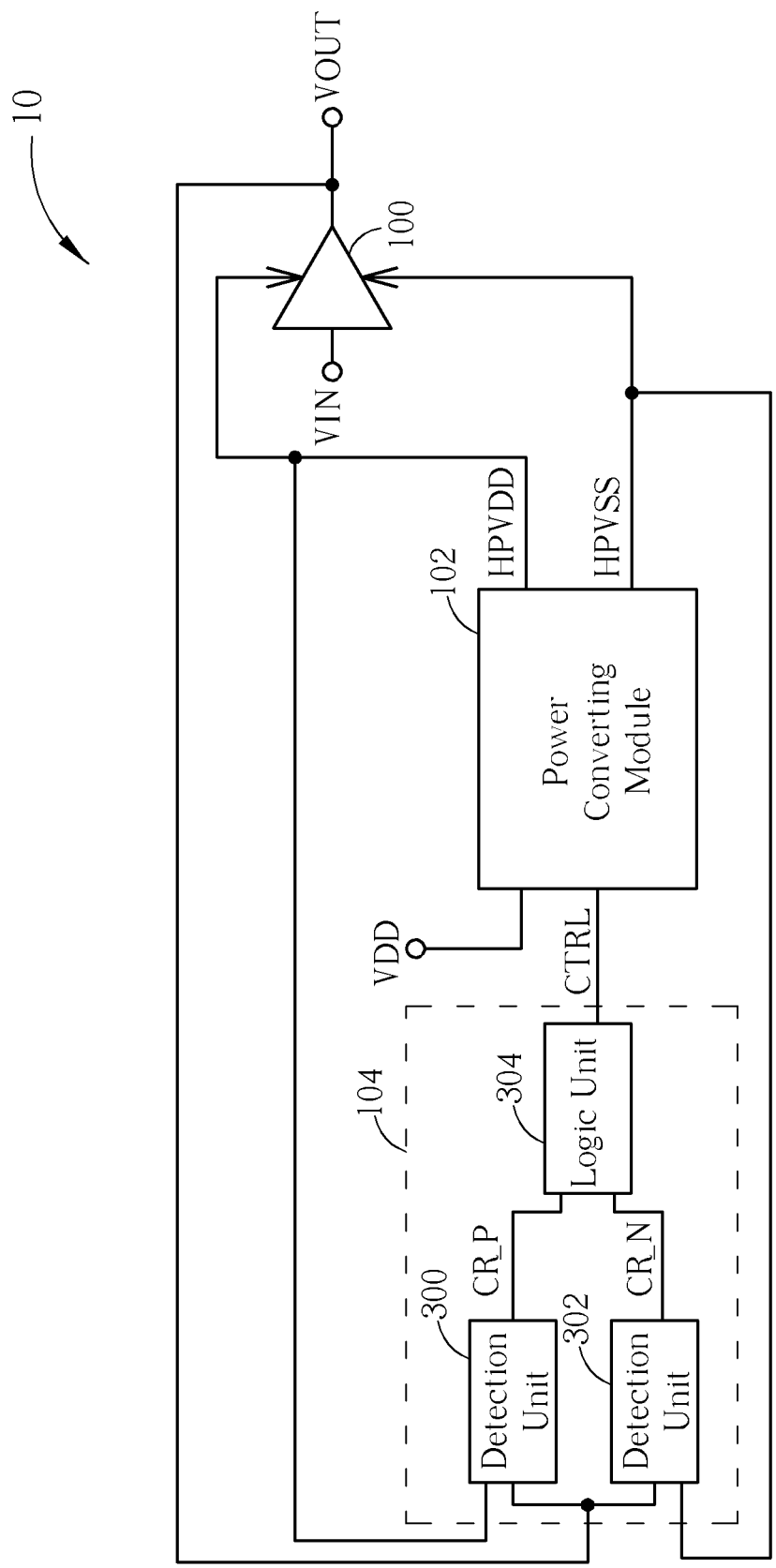
FIG. 3 is a schematic diagram of an implementation method of the amplifier system shown in FIG. 1.

Noticeably, the amplifier system 10 shown in FIG. 1 is the embodiment of the present invention and utilized for explaining the concept of the present invention with block diagrams. The implementation methods of each block and the forms of the related signals can be appropriately modified according to requirements of various systems. For example, please refer to FIG. 3, which is a schematic diagram of an implementation method of the amplifier system 10 shown in FIG. 1. As shown in FIG. 3, the level detection module 104 comprises detection units 300 and 302 and a logic unit 304. The detection unit 300 is utilized for detecting the positive voltage difference P_DIFF, comparing the positive voltage difference P_DIFF and the threshold VTH, and accordingly outputting a positive comparison result CR_P. The detection unit 302 is utilized for detecting the negative voltage difference N_DIFF, comparing the negative voltage difference N_DIFF and the threshold VTH, and accordingly outputting a negative comparison result CR_N. The logic unit 304 is utilized for outputting the control signal CTRL according to the positive comparison result CR_P and the negative comparison result CR_N, to control the power converting module 102 to adjust the supply voltages HPVDD and HPVSS. The detailed operations of the amplifier system 10 shown in FIG. 3 can be referred to the above, and are not narrated herein for brevity.

Besides, the main spirit of the present invention is detecting the differences between the output signal of the amplifier and the supply voltages of the amplifier, for decreasing the range of the supply voltages when the swing of the output signal is small to decrease the power consumption of the amplifier, and increasing the range of the supply voltages when the swing of the output signal is great to prevent the output signal from being distorted. According to different applications, those skilled in the art can appropriately observe various alternations and modifications. For example, the supply voltages HPVDD and HPVSS can be preset to the voltages V1 and (−V1), for avoiding the output signal VOUT exceeding the range from the voltage V2 to the voltage (−V2) and being distorted when the amplifier system 10 starts operating. In addition, the supply voltages HPVDD and HPVDD can be separately altered instead of being simultaneously altered according to requirements of different systems. For example, the supply voltage HPVDD can be fixed to the voltage V1 and the supply voltage HPVSS can be switched between the voltages (−V1) and (−V2) according to the control signal CTRL. Similarly, the supply voltage HPVSS can be fixed to the voltage (−V1) and the supply voltage HPVDD can be switched between the voltages V1 and V2 according to the control signal CTRL.

Figure 4:
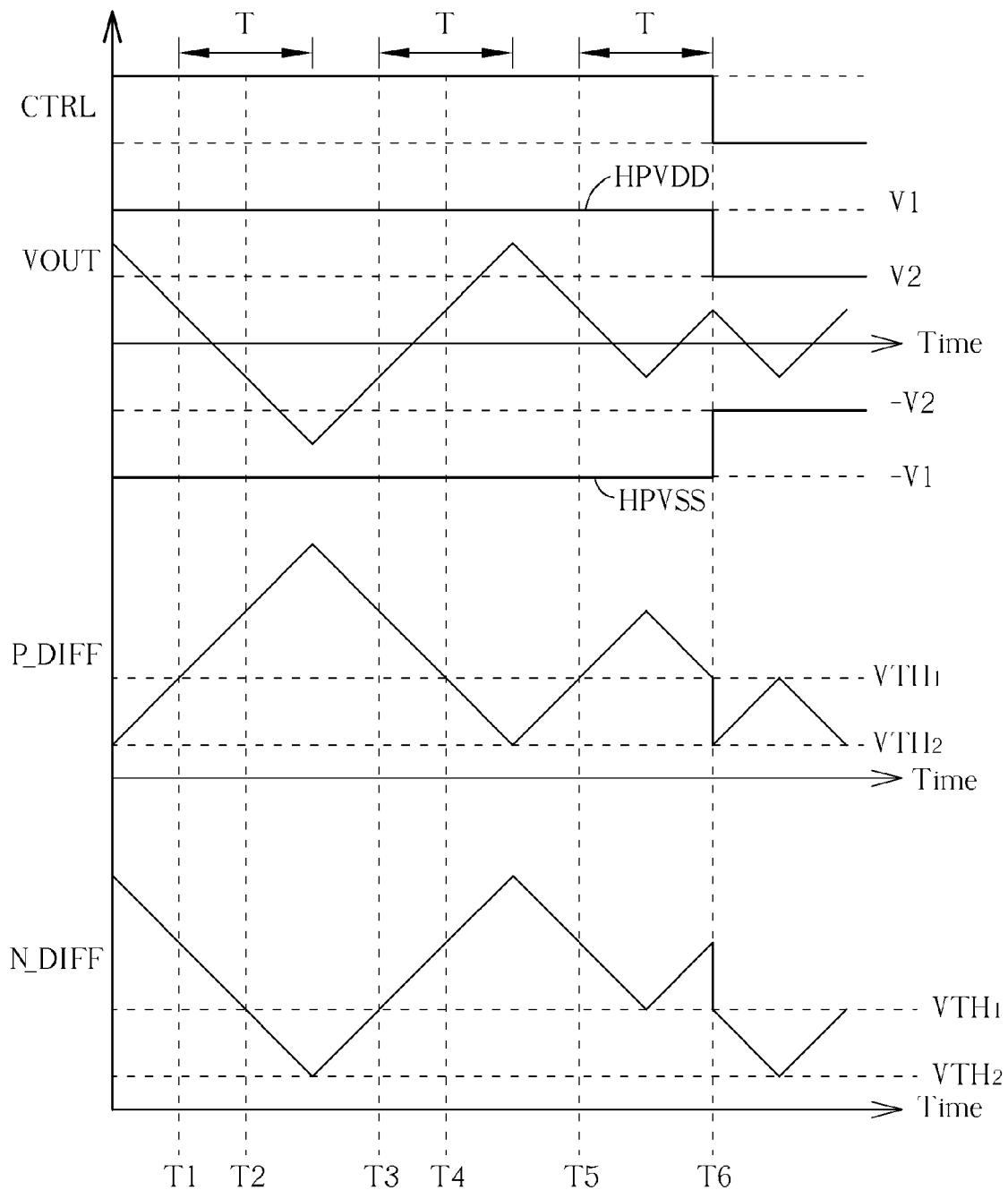
FIG. 4 is another waveform of related signals when the amplifier system shown in FIG. 1 is operating.

Furthermore, the amplifier system 10 may comprise a delay unit (not shown in FIG. 1) between the power converting module 102 and the level detection unit 104, for delaying a time T when the control signal CTRL is switched from high logic level to low logic level, to avoid the supply voltages HPVDD and HPVSS varying too frequently such that the performance of the amplifier module 100 is decreased. Please refer to FIG. 4, which is a waveform of related signals when the amplifier system 10 with the delay unit is operating. As shown in FIG. 4, at a time T1, although both the positive voltage difference P_DIFF and the negative voltage difference N_DIFF are greater than the threshold VTH1, the control signal CTRL does not change because of the negative voltage difference N_DIFF is smaller than the threshold VTH1 at a time T2, which is in the interval of the time T1 plus the time T. Since the control signal CTRL does not change, the supply voltages HPVDD and HPVSS do not change either. Similarly, although both the positive voltage difference P_DIFF and the negative voltage difference N_DIFF are greater than the threshold VTH1, the control signal CTRL does not change because of the positive voltage difference P_DIFF is smaller than the threshold VTH1 at a time T4, which is in the interval of the time T3 plus the time T. Since the control signal CTRL does not change, the supply voltages HPVDD and HPVSS do not change. Finally, both the positive voltage difference P_DIFF and the negative voltage difference N_DIFF are greater than the threshold VTH1 at a time T5 and within the interval of the time T5 plus the time T. At a time T6 (i.e. the time T5 plus the time T), the control signal CTRL is therefore switched from the high logic level to low logic level and the supply voltages HPVDD and HPVSS are respectively adjusted to the voltages V2 and (−V2).

Figure 5:
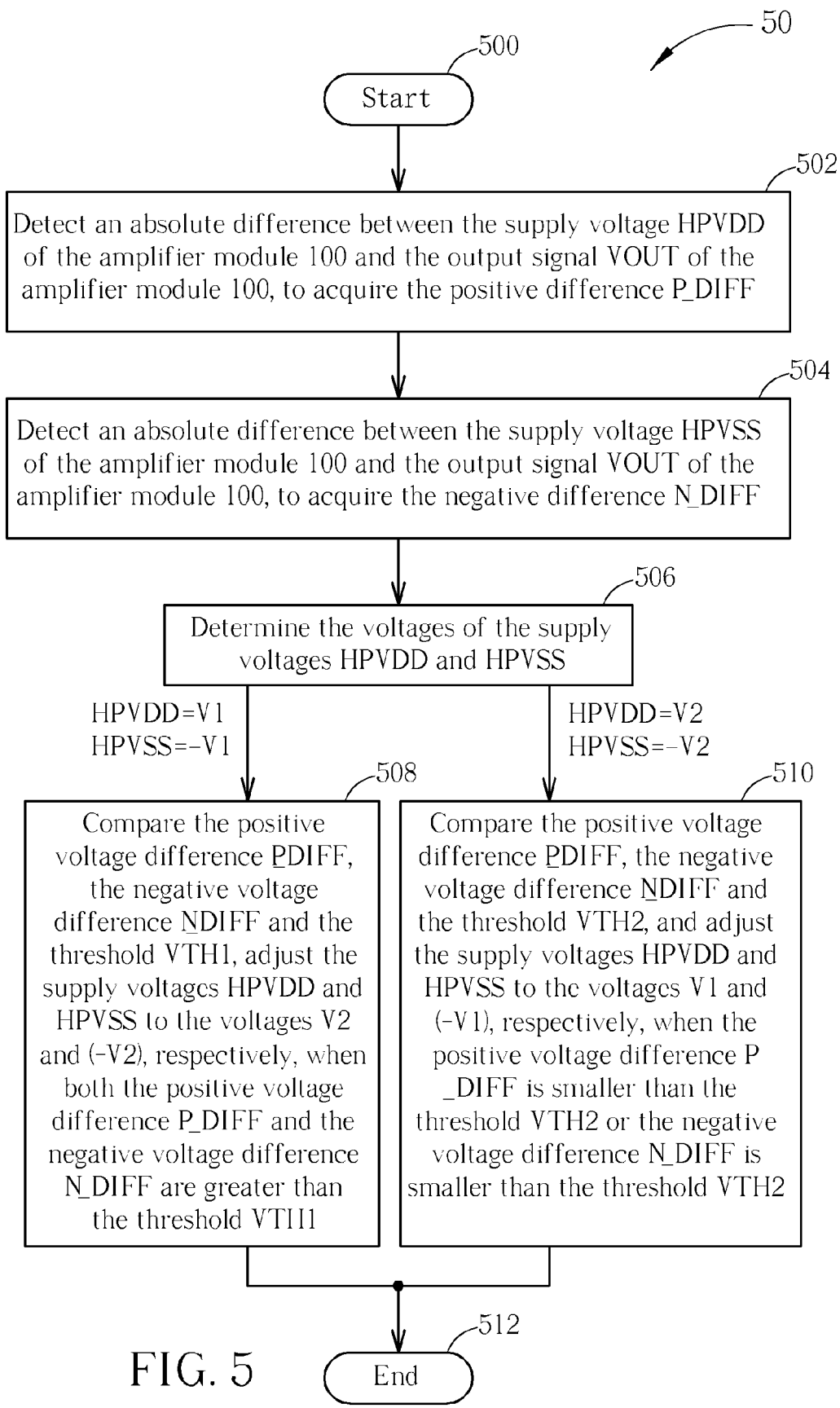
FIG. 5 is a flowchart of a dynamic power control method according to an embodiment of the present invention.

Furthermore, the operating principle of the amplifier system 10 adjusting the supply voltages HPVDD and HPVSS can be summarized to a dynamic power control method 50. Please refer to FIG. 5, which is a flowchart of the dynamic power control method according to an embodiment of the present invention. As shown in FIG. 5, the power control method 50 comprises:

Step 500: Start.

Step 502: Detect an absolute difference between the supply voltage HPVDD of the amplifier module 100 and the output signal VOUT of the amplifier module 100, to acquire the positive difference P_DIFF.

Step 504: Detect an absolute difference between the supply voltage HPVSS of the amplifier module 100 and the output signal VOUT of the amplifier module 100, to acquire the negative difference N_DIFF.

Step 506: Determine the voltages of the supply voltages HPVDD and HPVSS and execute Step 508 when the supply voltage HPVDD is the voltage V1 and the supply voltage HPVSS is the voltage (−V1), otherwise execute Step 510.

Step 508: Compare the positive voltage difference P_DIFF, the negative voltage difference N_DIFF and the threshold VTH1, and adjust the supply voltages HPVDD and HPVSS to the voltages V2 and (−V2), respectively, when both the positive voltage difference P_DIFF and the negative voltage difference N_DIFF are greater than the threshold VTH1.

Step 510: Compare the positive voltage difference P_DIFF, the negative voltage difference N_DIFF and the threshold VTH2, and adjust the supply voltages HPVDD and HPVSS to the voltages V1 and (−V1), respectively, when the positive voltage difference P_DIFF is smaller than the threshold VTH2 or the negative voltage difference N_DIFF is smaller than the threshold VTH2.

Step 512: End.

Via the dynamic power control method 50, the supply voltages HPVDD and HPVSS of the amplifier module 100 can be timely adjusted, to decrease the average power consumption of the amplifier module 100.

Figure 6:
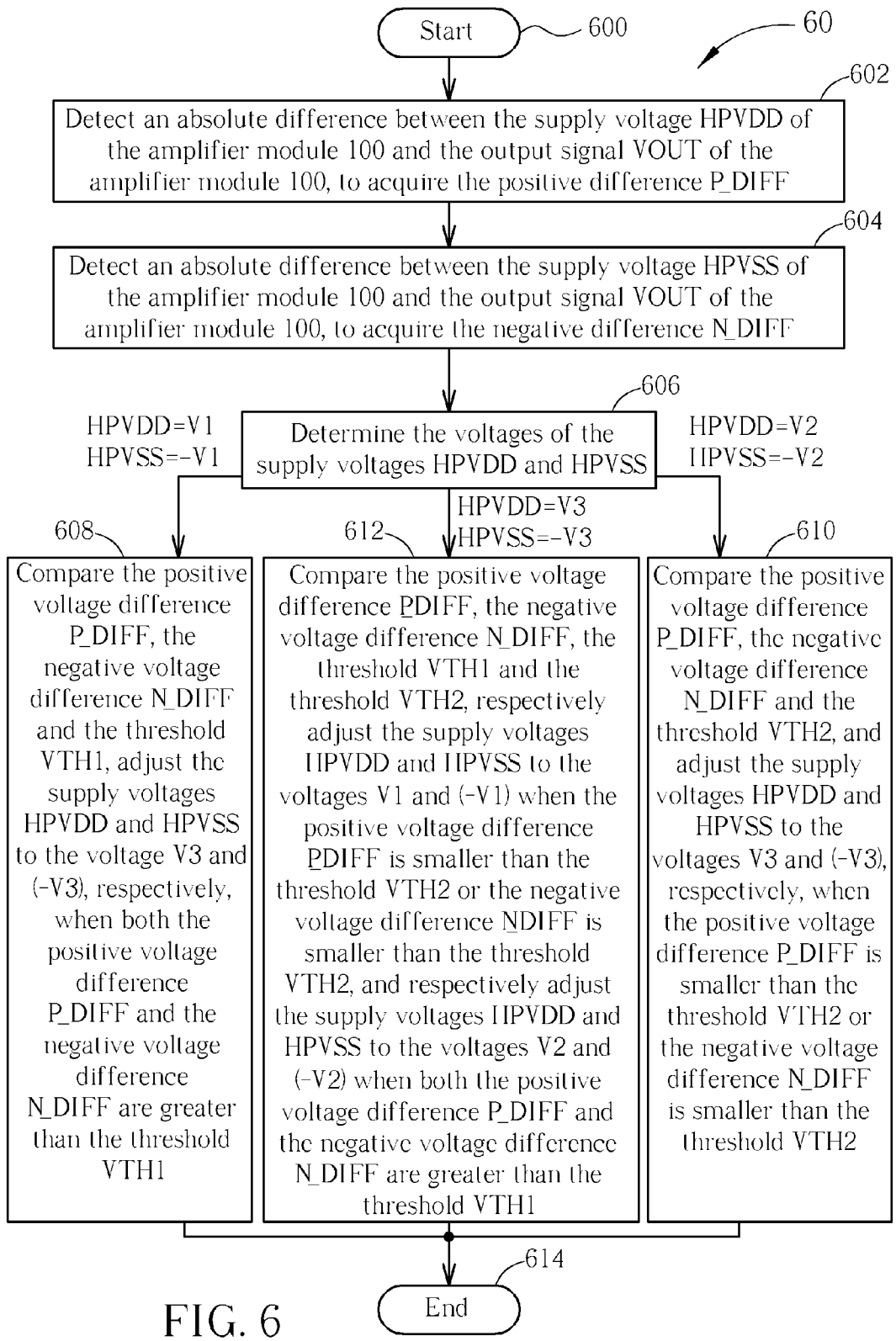
FIG. 6 is a flowchart of another dynamic control method according to an embodiment of the present invention.

In addition, the dynamic power control method 50 can be appropriately modified such that the supply voltages HPVDD and HPVSS can be switched among multiple voltages, to further improve the efficiency of the amplifier module 100. For example, please refer to FIG. 6, which is a flowchart of a dynamic power control method 60 according to an embodiment of the present invention. As shown in FIG. 6, the dynamic power control method 60 comprises:

Step 600: Start.

Step 602: Detect an absolute difference between the supply voltage HPVDD of the amplifier module 100 and the output signal VOUT of the amplifier module 100, to acquire the positive difference P_DIFF.

Step 604: Detect an absolute difference between the supply voltage HPVSS of the amplifier module 100 and the output signal VOUT of the amplifier module 100, to acquire the negative difference N_DIFF.

Step 606: Determine the voltages of the supply voltages HPVDD and HPVSS, execute Step 608 when the supply voltage HPVDD is the voltage V1 and the supply voltage HPVSS is the voltage (−V1), execute Step 610 when the supply voltage HPVDD is the voltage V2 and the supply voltage HPVSS is the voltage (−V2), and execute Step 612 when the supply voltage HPVDD is a voltage V3 and the supply voltage HPVSS is a voltage (−V3).

Step 608: Compare the positive voltage difference P_DIFF, the negative voltage difference N_DIFF and the threshold VTH1, and adjust the supply voltages HPVDD and HPVSS to the voltage V3 and (−V3), respectively, when both the positive voltage difference P_DIFF and the negative voltage difference N_DIFF are greater than the threshold VTH1.

Step 610: Compare the positive voltage difference P_DIFF, the negative voltage difference N_DIFF and the threshold VTH2, and adjust the supply voltages HPVDD and HPVSS to the voltages V3 and (−V3), respectively, when the positive voltage difference P_DIFF is smaller than the threshold VTH2 or the negative voltage difference N_DIFF is smaller than the threshold VTH2.

Step 612: Compare the positive voltage difference P_DIFF, the negative voltage difference N_DIFF, the threshold VTH1 and the threshold VTH2, respectively adjust the supply voltages HPVDD and HPVSS to the voltages V1 and (−V1) when the positive voltage difference P_DIFF is smaller than the threshold VTH2 or the negative voltage difference N_DIFF is smaller than the threshold VTH2, and respectively adjust the supply voltages HPVDD and HPVSS to the voltages V2 and (−V2) when both the positive voltage difference P_DIFF and the negative voltage difference N_DIFF are greater than the threshold VTH1.

Step 614: End.

In comparison with the dynamic power control method 50, the dynamic power control method 60 can further adjust the supply voltage HPVDD to the voltage V3 and adjust the supply voltage HPVSS to the voltage (−V3). The voltage V3 is within a range between the voltage V1 and the voltage V2 (i.e. V1>V3>V2), and the voltage (−V3) is within a range between the voltage (−V1) and the voltage (−V2) (i.e. (−V2) >(−V3)>(−V1)). Via appropriately setting the thresholds VTH1 and VTH2, the dynamic power control method 60 can adjust the supply voltages HPVDD and HPVSS with more accurate scales, to improve the efficiency of the amplifier module 100.

To sum up, the dynamic power control method disclosed by the present invention and the circuit thereof utilize detecting the differences between the output signal of the amplifier and the supply voltages of the amplifier for appropriately adjusting the supply voltages, to decrease the average power consumption of the amplifier. Comparing to the prior art, dynamic power control method disclosed by the present invention and the system thereof do not need to be redesigned for accurately adjusting the supply voltages when the structure or the gain of the amplifier changes. The design flow the amplifier can be therefore simplified and the design cost of the amplifier can be reduced.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A dynamic power control method, for an amplifier, comprising:
 detecting an absolute difference between a positive supply voltage of the amplifier and an output voltage of the amplifier, to acquire a positive voltage difference;
 detecting an absolute difference between a negative supply voltage of the amplifier and the output voltage of the amplifier, to acquire a negative voltage difference; and
 adjusting the positive supply voltage and the negative supply voltage according to the positive voltage difference, the negative voltage difference and a threshold.

2. The dynamic power control method of claim 1, wherein the positive supply voltage is within a first positive voltage and a second positive voltage and the negative supply voltage is within a first negative voltage and a second negative voltage.

3. The dynamic power control method of claim 2, wherein the first positive voltage is greater than the second positive voltage and the first negative voltage is smaller than the second negative voltage.

4. The dynamic power control method of claim 3 further comprising presetting the positive supply voltage to the first positive voltage and presetting the negative supply voltage to the first negative voltage.

5. The dynamic power control method of claim 3, wherein the threshold is a first threshold when the positive supply voltage is the first positive voltage and the negative supply voltage is the first negative voltage.

6. The dynamic power control method of claim 5, wherein the step of adjusting the positive supply voltage and the negative supply voltage according to the positive voltage difference, the negative voltage difference and the threshold comprises:
 comparing the positive voltage difference and the threshold;
 comparing the negative voltage difference and the threshold; and
 adjusting the positive supply voltage to the second positive voltage and adjusting the negative supply voltage to the second negative voltage, when both the positive voltage difference and the negative voltage difference are greater than the threshold.

7. The dynamic power control method of claim 5, wherein the threshold is a second threshold when the positive supply voltage is the second positive voltage and the negative supply voltage is the second negative voltage.

8. The dynamic power control method of claim 7, wherein the step of adjusting the positive supply voltage and the negative supply voltage according to the positive voltage difference, the negative voltage difference and the threshold comprises:
 comparing the positive voltage difference and the threshold; and
 adjusting the positive supply voltage to the first positive voltage and adjusting the negative supply voltage to the first negative voltage, when the positive voltage difference is smaller than the threshold.

9. The dynamic power control method of claim 7, wherein the step of adjusting the positive supply voltage and the negative supply voltage according to the positive voltage difference, the negative voltage difference and the threshold comprises:
 comparing the negative voltage difference and the threshold; and
 adjusting the positive supply voltage to the first positive voltage and adjusting the negative supply voltage to the first negative voltage, when the negative voltage difference is smaller than the threshold.

10. A dynamic power control circuit, for an amplifier, comprising:
 a power converting module, for converting a system supply voltage to a positive supply voltage of the amplifier and a negative supply voltage of the amplifier according to a power control signal; and
 a level detection module, comprising:
  a first detection unit, for detecting an absolute difference between an output voltage of the amplifier and the positive supply voltage to acquire a positive voltage difference, and comparing the positive voltage difference and a threshold to output a positive control signal;
  a second detection unit, for detecting an absolute difference between the output voltage and the negative supply voltage to acquire a negative voltage difference, and comparing the negative voltage difference and the threshold to output a negative control signal; and
  a logic unit, coupled to the power converting module, for outputting the power control signal according to the positive control signal and the negative control signal.

11. The dynamic power control circuit of claim 10, wherein the positive supply voltage is within a first positive voltage and a second positive voltage and the negative supply voltage is within a first negative voltage and a second negative voltage.

12. The dynamic power control circuit of claim 11, wherein the first positive voltage is the positive system supply voltage and the first negative voltage is the negative system supply voltage.

13. The dynamic power control circuit of claim 11, wherein the first positive voltage is greater than the second positive voltage and the first negative voltage is smaller than the second negative voltage.

14. The dynamic power control circuit of claim 13, wherein the threshold is a first threshold when the positive supply voltage is the first positive voltage and the negative supply voltage is the first negative voltage.

15. The dynamic power control circuit of claim 14, wherein the logic unit adjusts the power control signal for controlling the power converting module to adjust the positive supply voltage to the second positive voltage and adjust the negative supply voltage to the second negative voltage, when the positive control signal outputted by the first detection unit indicates the positive voltage difference is greater than the threshold and the negative control signal outputted by the second detection unit indicates the negative voltage difference is greater than the threshold.

16. The dynamic power control circuit of claim 14, wherein the threshold is a second threshold when the positive supply voltage is the second positive voltage and the negative supply voltage is the second negative voltage.

17. The dynamic power control circuit of claim 16, wherein the logic unit adjusts the power control signal for controlling the power converting module to adjust the positive supply voltage to the first positive voltage and adjust the negative supply voltage to the first negative voltage, when the positive control signal outputted by the first detection unit indicates the positive voltage difference is smaller than the threshold.

18. The dynamic power control circuit of claim 16, wherein the logic unit adjusts the power control signal for controlling the power converting module to adjust the positive supply voltage to the first positive voltage and adjust the negative supply voltage to the first negative voltage, when the negative control signal outputted by the second detection unit indicates the negative voltage difference is smaller than the threshold.

* * * * *